United States Patent

Song et al.

[11] Patent Number: 6,043,970
[45] Date of Patent: Mar. 28, 2000

[54] HIGH VOLTAGE DRIVING CIRCUIT REDUCING A TRANSIENT CURRENT

[75] Inventors: Q Sang Song; Mun Yang Park; Won Chul Song; Jin Gun Koo, all of Daejon, Rep. of Korea

[73] Assignee: Electronics and Telecommunications Research Institute, Daejeon, Rep. of Korea

[21] Appl. No.: 09/136,611

[22] Filed: Aug. 20, 1998

[30] Foreign Application Priority Data

Aug. 30, 1997 [KR] Rep. of Korea ............. 97-43554

[51] Int. Cl.$^7$ .................................. H02H 3/00
[52] U.S. Cl. ............. 361/111; 361/56; 361/115; 361/118
[58] Field of Search .................. 361/56, 58, 91.1, 361/111, 113, 115, 118, 119

[56] References Cited

U.S. PATENT DOCUMENTS

| | | | |
|---|---|---|---|
| 3,803,585 | 4/1974 | Urade et al. | 340/324 |
| 4,677,317 | 6/1987 | Sakuma | 307/443 |
| 5,397,942 | 3/1995 | Yamada | 326/82 |

OTHER PUBLICATIONS

Masaji Nakano, Keiju Takahashi, Akio Tanaka, Ami Osawa and Hiroshi Yoshida; Full–Complementary High–Voltage Driver ICs for Flat Display Panels; 1989; pp. 29–36.

*Primary Examiner*—Stephen W. Jackson
*Attorney, Agent, or Firm*—Antonelli, Terry, Stout & Kraus, LLP

[57] ABSTRACT

The present invention relates to a high voltage driving circuit for preventing an transient current. The high voltage driving circuit including a non-overlap signal generator for generating the first and second non-overlap signals in response to the logic level signal, a satge for generating a first driving signal in response to the logic level signal and the first and second non-overlap signals, a pre-driving circuit which is driven in response to the first non-overlap signal and the first driving signal, and a complementary output circuit for controlling a current flowing toward the output terminal in response to the output signal of the pre-driving circuit and the second non-overlap signal.

7 Claims, 5 Drawing Sheets

HIGH VOLTAGE DRIVING CIRCUIT REDUCING A TRANSIENT CURRENT

FIELD OF INVENTION

The invention relates to a high voltage driving circuit and more particularly, to a high voltage driving circuit for preventing a transient current from occurring during signal switching.

BACKGROUND OF THE INVENTION

In general, a high voltage driving circuit is used for flat display panel (FDP) devices such as plasma display panel PDP devices, an Electro Luminescence Display (ELD), a Vacumm Fluorescent Display (VFD) or Field Emission Display (FED).

Such a high voltage driving circuit serves to drive a load by converting a signal having a logic level of 5 volts to a high signal more than tens of volts. A core skill in a high voltage driving circuit is to improve operating speed and to minimize power consumption. A number of high voltage driving circuits are required in the color display devices and therefore, even though a static current or a transient current flowing through any output terminal is small, an overall current and power dissipating at a display device become very large, resulting in an increase in power consumption.

As one conventional method for decreasing the power consumption in a high voltage circuit, there has been used a method for decreasing a static current. FIG. 1 shows an representative high voltage driving circuit according to the prior art, and FIG. 2 shows input/output waveforms which represent an output voltage Vout, a transient current IT flowing through an output transistor and a load current IL. This conventional high voltage driving circuit comprises a level shift circuit 1 for converting an input voltage Vin having a logic level to a high level of voltage and a complementary output circuit 2 for driving a load. The level shift circuit 1 comprises a latch circuit formed by P-channel transistors M1 and M3 and N-channel transistors M2 and M4, and prevents a possible flow of the static current during a time duration that a signal maintains a high state or low state. However, transistors M5 and M6 of the complementary output circuit 2 have a little rising and falling time during switching, so that there exists a time duration that transistors M5 and M6 of the complementary output circuit 2 have a little rising and falling time during switching, so that there exists a time a duration that transistors M5 and M6 are turned on simultaneously. Accordingly, during this time, and transient current IT flows as shown in FIG. 2. Likewise, even though the transient current is small compared to that of the complementary output circuit 2, it flows through transistors M1 and M2 which are connected in series between power source terminal VDDH and a ground terminal GND, and also flows through transistors M3 and M4 in the level shift circuit 1. As a result, even though the high voltage driving circuit in FIG. 1 can exclude the static current, it has a disadvantage that causes unnecessary power consumption because of a transient current which occurred during switching.

SUMMARY OF THE INVENTION

Accordingly, the object of the present invention is to provide a high voltage driving circuit for excluding a transient current flowing through the two transistors by inserting a short duration signal generating circuit, which generates a short signal pulse only at the moment of signal switching, resulting in prevention of complementary pull-up and pull-down transistors from being turned on simultaneously and preventing a transient current from flowing through the two transistors.

To achieve the above object, the present invention is characterized in that the high voltage driving circuit comprises: a non-overlap signal generator for generating the first and second non-overlap signals in response to the logic level signal; a stage for generating a first driving signal in response to the logic level signal and the first and second non-overlap signals; a pre-driving circuit which is driven in response to the first non-overlap signal and the first driving signal; and a complementary output circuit for controlling a current flowing toward the output terminal in response to the output signal of the pre-driving circuit and the second non-overlap signal.

BRIEF DESCRIPTION OF THE DRAWINGS

The present invention will be become more apparent by describing in detail preferred embodiments thereof with reference to the attached drawings, in which.

Similar reference characters refer to similar parts in the several views of the drawings.

DESCRIPTION OF THE PREFERRED EMBODIMENTS

Figure 1:
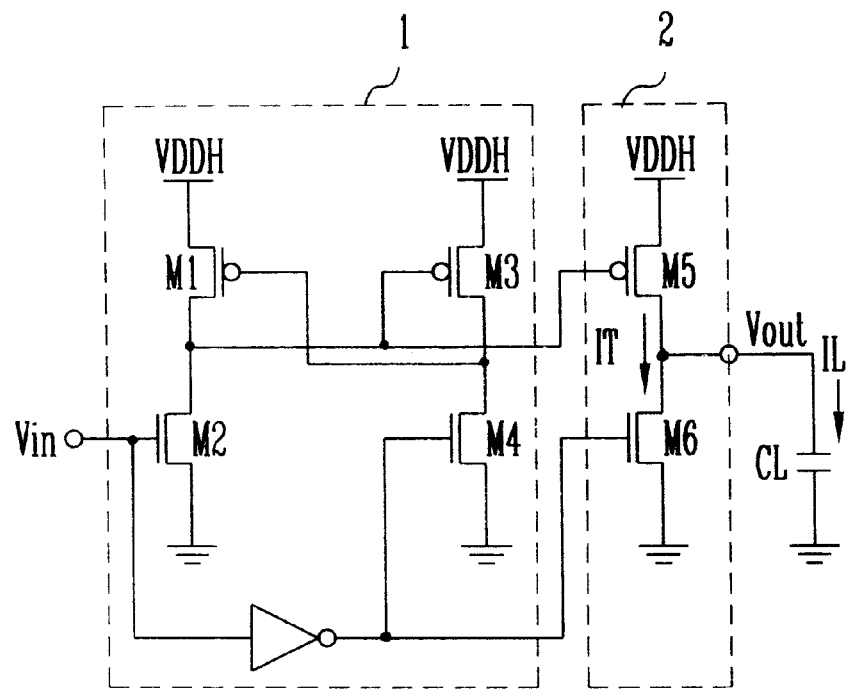
FIG. 1 is a high voltage driving circuit according to prior art.
Figure 2:
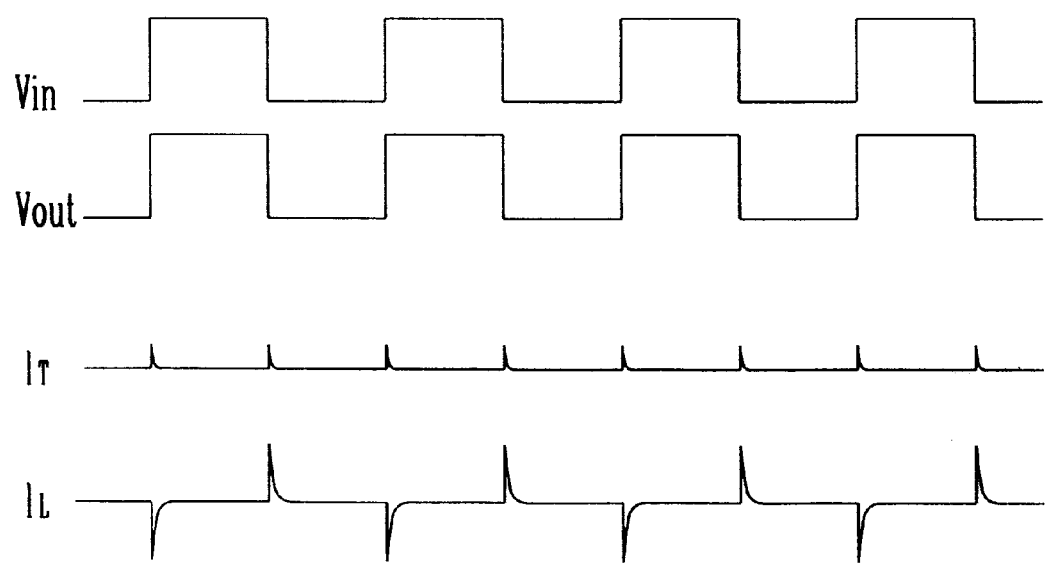
FIG. 2 is input/output waveforms of the high voltage driving circuit in FIG. 1.
Figure 3:
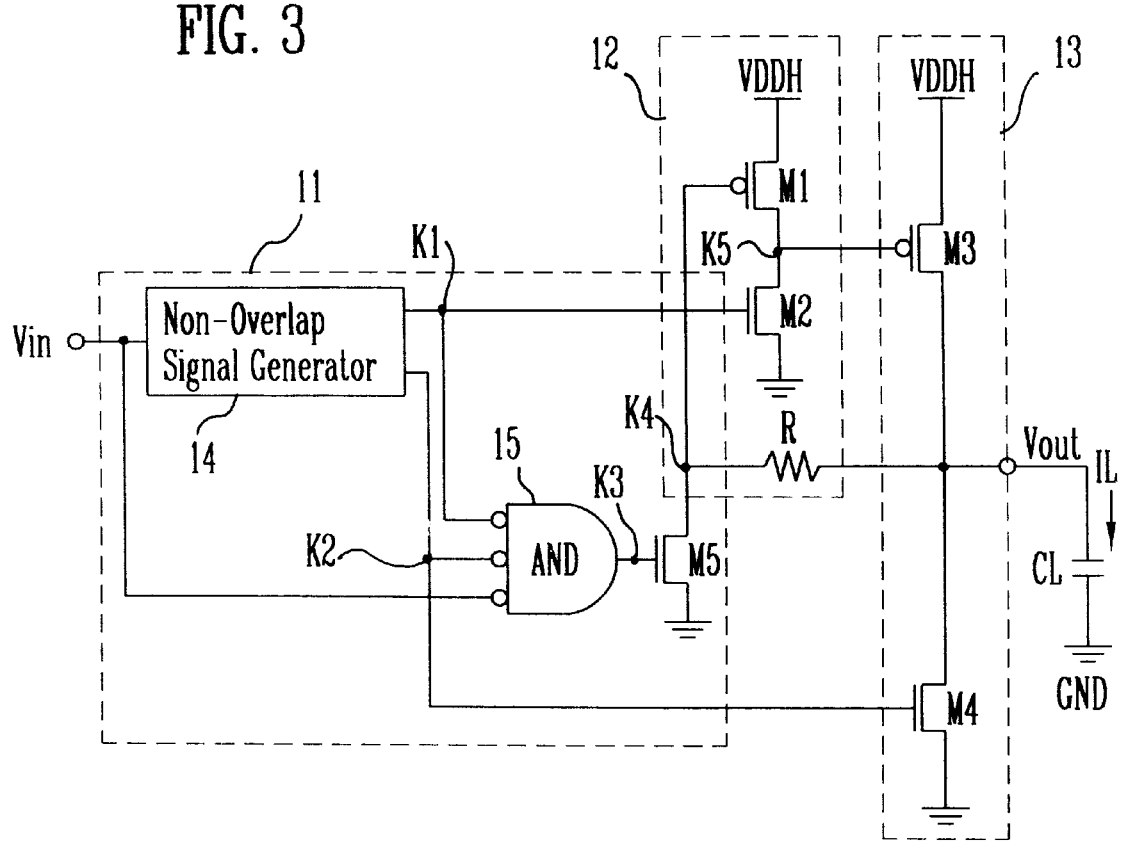
FIG. 3. Is the first embodiment of a high voltage driving circuit according to the present invention.

FIG. 3 shows an embodiment of a high voltage driving circuit according to the present invention. The high voltage driving circuit comprises a signal generating stage 11, a pre-driving circuit 12 and a complementary output circuit 13, mainly. The signal generating stage 11 consists of a non-overlap signal generator 14 for generating the first and second non-overlap signals, an AND gate stage 15 for generating the first driving signal to an N-channel transistor MS. The pre-driving circuit 12 consist of a P-channel transistor M1, as a pull-up transistor, connected in series between the power terminal as high voltage source VDDH, and the ground terminal; and N-channel transistor M2, as a pull-down transistor; and a resistor R which feedbacks an output voltage Vout to the input of the P-channel transistor M1. A complementary output circuit is formed by a P-channel transistor 13 as a pull-up transistor and an N-channel transistor 14 as a pull-down transistor which are connected in series between the power terminal and the ground terminal.

Figure 4:
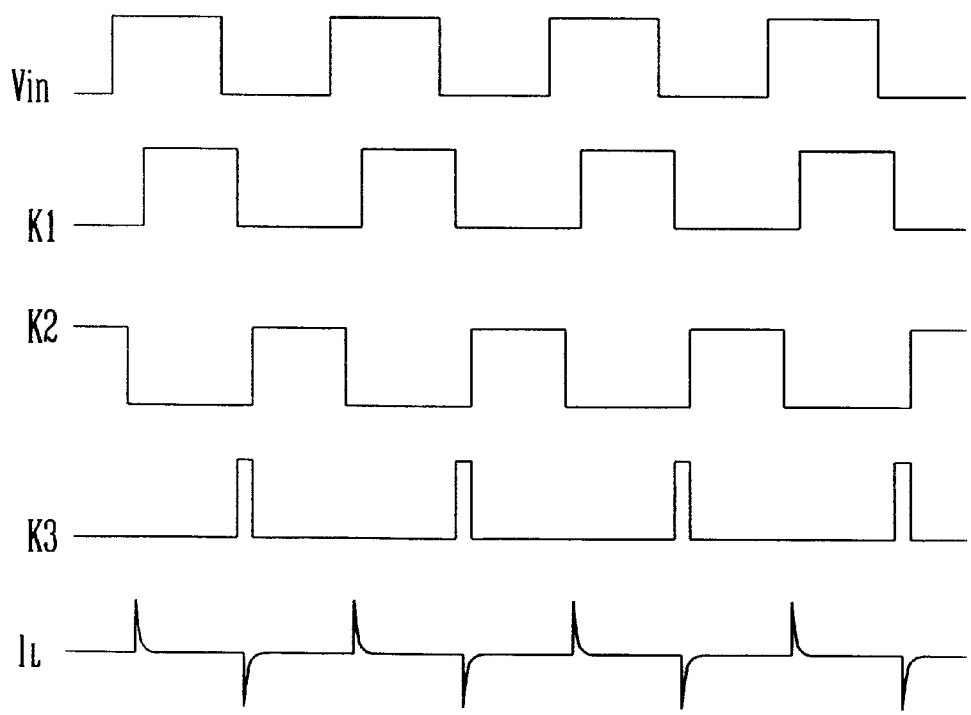
FIG. 4 is input/output waveforms of the high voltage driving circuit in FIG. 3.

FIG. 4 is input/output waveforms of high voltage circuit in FIG. 3 and shows waveforms in nodes K1, K2 and K3 and an waveform of a load current IL flowing through a capacitor CL. The non-overlap signal generator 14 and an AND gate 15 in FIG. 3 form a logic circuit that operates on about 5 volts, and transistors MI to M5 operate on high voltage VDDH more than tens of voltage. P-channel transistors M1 and M3 are formed of a thick oxide gate structure and N-channel transistors M2, M4, M5 are formed of a thin oxide gate structure.

A level shifting from a logic level voltage to a high level voltage is accomplished by transistors M1 and M2 forming pre-driving circuit 12, and the pull-up transistor M3 of the complementary output circuit 13 becomes driven by a high voltage. The pull-up and pull-down transistors M3 and M4 forming the complementary output circuit 13 drive a load and form a latch circuit with transistors M1 and M2 of the pre-driving circuit 12 thereby preventing the flow of static current on operation.

However, in case that the four transistors forming a latch circuit are switched, there exists a time duration in which transistors M1 and M2 or transistors M3 and M4 are turned on simultaneously, because of a rising time or a falling time of transistor or because of signal delay characteristics of the latch circuit, resulting in occurring of an transient current. Because an transient current flowing through the pull-up and pull-down transistors M3 and M4 of complementary circuit 13 is large compared to that of transistors M1 and M2 of the pre-driving circuit 12, the transient current flowing through pull-up and pull-down transistor M3 and M4 mainly cause an unnecessary power consumption.

According to the present invention, the transient current flowing through the pull-up and pull-down transistors M3 and M4 is excluded by letting the pull-down transistor M4 become turned-off before turning-on of the pull-up transistor M3 or the letting the pull-up transistor M3 become turned-off before turning-on the pull-down transistor M4.

The transient current flowing through the pull-up and pull-down transistors M3 and M4 that form the complementary output circuit 13 is excluded by a non-overlap signal generator 14 of the signal generating unit 11, an AND gate 15, a transistor M5 and a resistor R of the pre-driving circuit 12. The non-overlap signal generator 14 receives an input signal Vin and outputs the non-overlap signal having waveforms such as K1 and K2. The transient current occurring instantaneously when the pull-up transistor M3 becomes turned on and the pull-down transistor M4 becomes turned off, is easily excluded by introducing the said non-overlap signal to each gate of transistors M2 and M4. The output of the AND gate 15 that receives, as input signals, the inverted signals of three signals, two non-overlap signals and one input signal Vin is outputted as a short pulse such as a waveform K3 shown in FIG. 4. The high state time duration of this short pulse is located between the time that the waveform of node K1 is shifted from high state to low state and the time that the waveform of node K2 is shifted from low state to high state. By this short pulse, transistor M5 is turned on, node K4 is shifted to low state and transistor M1 is turned on. If transistor M1 is turned on, the voltage of node K5 is shifted to high state and pull-up transistor M3, which receives the signal of node K5, is turned off.

With turning-off of the pull-up transistor M3, the short pulse disappears and pull-down transistor M4 is turned on. As a result, because after turning off of the pull-up transistor M3, the pull-down transistor M4 is turned on, the transient current flowing through the pull-up and pull-down transistors M3 and M4 is excluded. Resistor R serves to prevent output Vout from affecting node K4 in a moment that the drain voltage of transistor M5 is shifted to a low state due to the short pulse.

Figure 5:
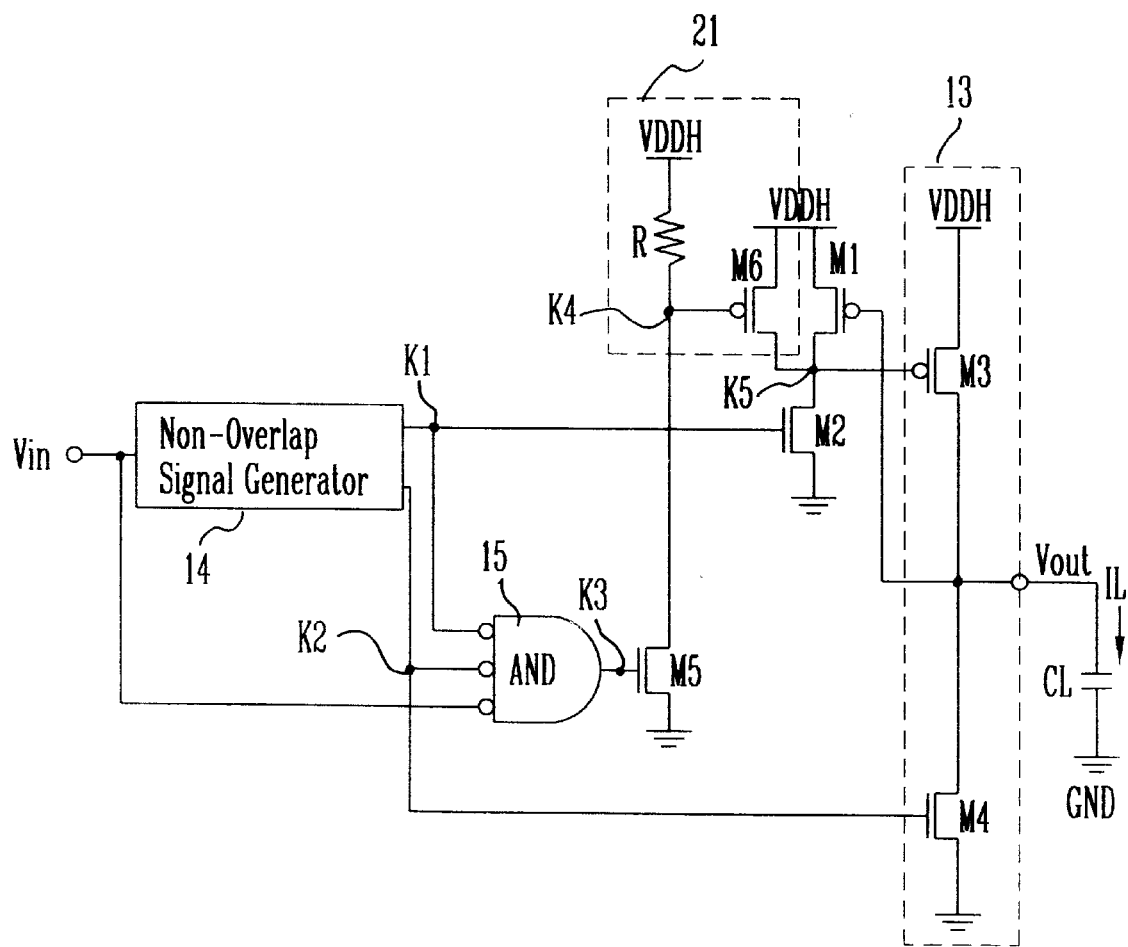
FIG. 5 is the second embodiment of a high voltage driving circuit according to the present invention.

FIG. 5 shows the second embodiment of high voltage driving circuit according to the present invention and its basic function is equal to FIG. 3. As shown in FIG. 5, resistor R is excluded on the pre-driving circuit 12, and the gate of transistor M1 is separated from node K4 and connected to output terminal Vout, compared to FIG. 3. Also, the first controlling circuit 21 consisting of resistor R and P-channel transistor M6 is interested. The output of AND gate 15 which receives, as an input signal, a non-overlap signal being outputted from the non-overlap signal generator 14 appears as a short pulse. By the short pulse, transistor M5 is turned in and then transistor M6 of the first controlling circuit is turned on. With turning-on of transistor M6, the voltage of node K5 becomes high state and transistor M3 of the complementary output 13 is turned off. With turning-off of transistor M3, the short pulse disappears, and transistor M4 is turned on. Accordingly, because after the transistor M3 is turned off, the transistor M4 is turned on, the transient current flowing through the transistors M3 and M4 is excluded. Even though it is small compared to the transient current flowing through transistors M3 and M4 in FIG. 3, a transient current is flowing through transistors MI and M2 in FIG. 5. To exclude this transient current, the second controlling circuit 31 for generating a short pulse is inserted in FIG. 3 as shown in FIG. 6.

Figure 6:
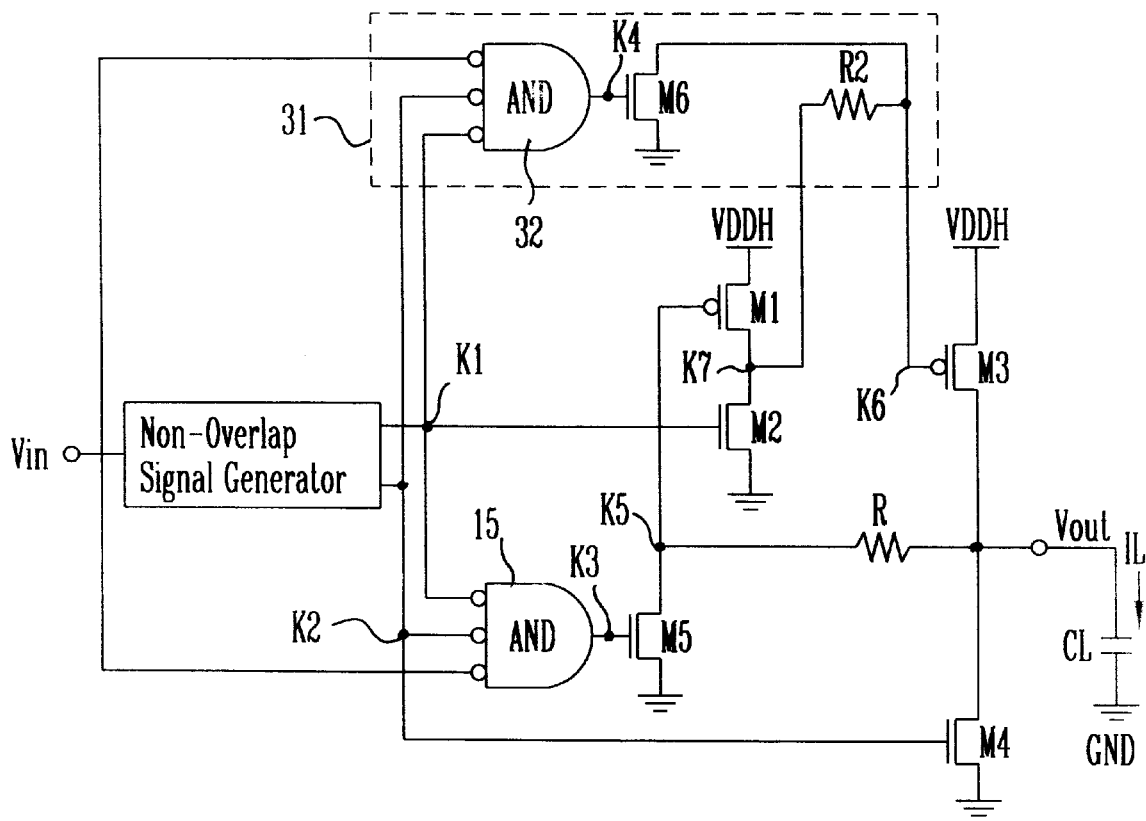
FIG. 6 is the third embodiment of a high voltage driving circuit according to the present invention.
Figure 7:
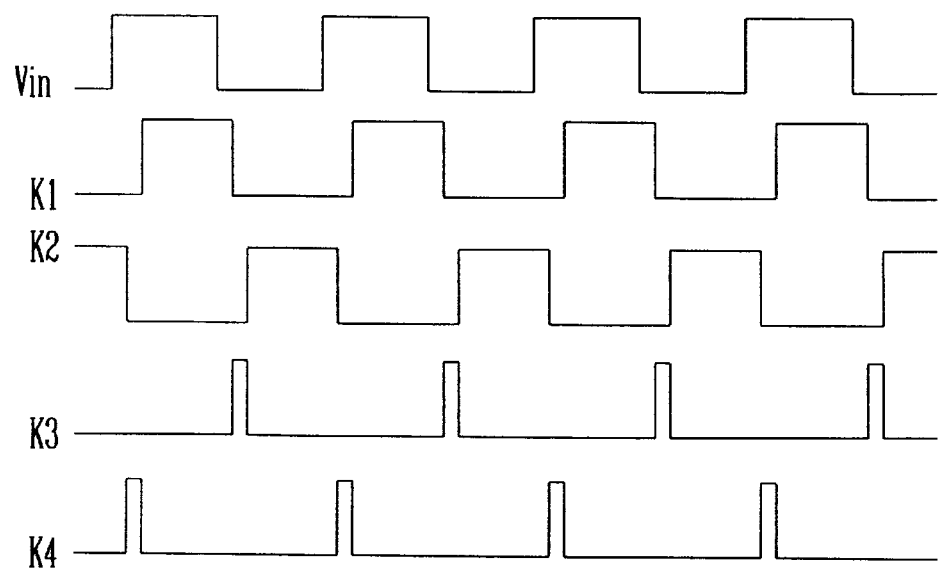
FIG. 7 is input/output waveforms of the high voltage driving circuit in FIG. 6.

FIG. 6 shows an another embodiment high voltage driving circuit according to the present invention. The second controlling circuit 31 comprises the second AND gate 32, a transistor M6 and a resistor R2. The signal of node K4 which is the output of the second AND gate 32, is a short pulse having a waveform such as K4 shown in FIG. 7. This short pulse has a high state duration between the time that the waveform of node K2 is shifted from high state to low state and the time waveform of node KI is shifted from low state to high state. This short pulse lets transistor M6 and then transistor M3 turn on state and lets output Vout turn to the high state and turn off transistor M1. With turning-off of transistor M1, the short pulse which is the output of the second AND gate 15 disappears, transistor H6 is turned off and transistor M2 is turned on.

Accordingly, because after transistor M1 is turned off, transistor M2 is turned on, the transient current flowing through transistor M1 and transistor M2 is excluded. The function of resistor R1 equals to that of resistor R1 in FIG. 3. Resistor R2 serves to prevent the voltage of node K7 from affecting the output of transistor M6 in a moment that the drain voltage of transistor M6 is shifted to a low state due to the short pulse. In case that the transient current flowing through transistor M1 and transistor M2 does not affect an overall power consumption of high voltage driving circuit, the second controlling circuit 31 in FIG. 6 can be omitted.

Figure 8:
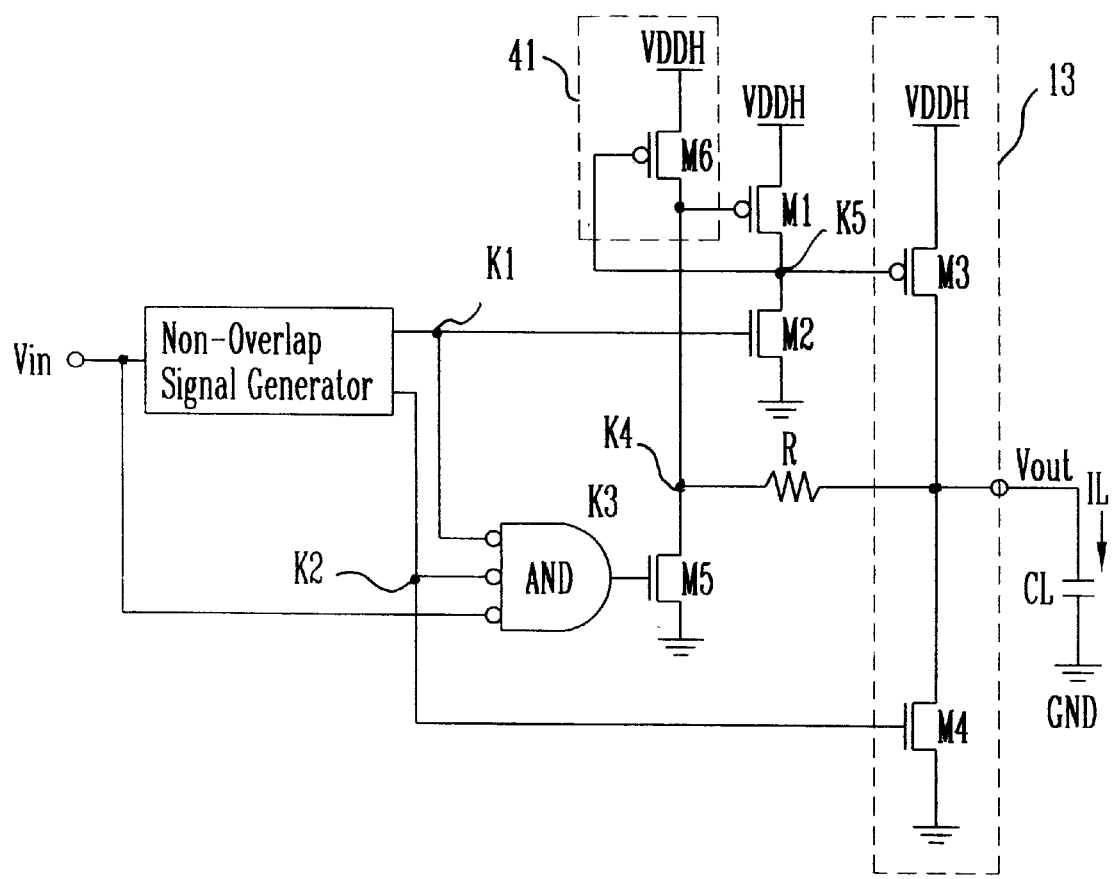
FIG. 8 is the fourth embodiment of a high voltage driving circuit according to the present invention.

FIG. 8 shows the fourth embodiment of high voltage driving circuit according to the present invention being used in case that there lots of currents flowing through a load in FIG. 3. In case that there are lots of currents flowing through a load, there is a high voltage drop across the source-drain of P-channel transistor M3 in the complementary output circuit 13, thereby a gate voltage of transistor M1 becomes low and transistor M1 can stay in turn on state. In this situation, a static current flows through transistor M1 and transistor M2. To solve this problem, P-channel transistor M6 as the third controlling circuit 41 is inserted as shown in FIG. 8. If transistor M3 becomes turned on, P-channel transistor M6 maintains turn on state, and in case that there is no current flowing through a load, both output Vout and node K4 maintain high state. In case that there happens a voltage drop across the source-drain of the transistor M3 because a current flowing through the output Vout is large, the voltage of node K4 becomes higher than the voltage of the output Vout, which is as high as the voltage drop that occurs on register R by current supplied from transistor M6. Therefore, by selecting a suitable value of transistor M6 and resistor R, it is possible for transistor M1 to be turned off even though the output voltage becomes low. Adoption of the third controlling circuit 41 as shown in FIG. 8 depends on the level of voltage drop across the source-drain of transistor M3 due to the output current.

As described in detail, according to the present invention, an unnecessary power consumption can be reduced by excluding an transient current that occurs during signal switching of the high voltage driving circuit. Also, by using the circuit for excluding an transient current according to the present invention, it is possible to overcome a problem that a small transient current occurred in a partial circuit causes a large amount of power consumption in an overall circuit, resulting in improving the power efficiency of the circuit.

We claim:

1. A high voltage driving circuit for preventing a transient current, comprising:
   a non-overlap signal generator for generating first and second non-overlap signals in response to a logic level signal;
   a stage for generating a driving signal in response to the logic level signal and the first and second non-overlap signals;
   a pre-driving circuit which is driven in response to the first non-overlap signal and the driving signal; and
   a complementary output circuit, which includes pull-up and pull-down transistors, which controls a current flowing toward the output terminal in response to the output signal of the pre-driving circuit and the second non-overlap signal.

2. A high voltage driving circuit for preventing a transient current according to claim 1, wherein the stage for generating the first driving signal comprises:
   an AND gate for receiving, as input signals, the logic level signal and the first and second non-overlap signals; and
   an N-channel transistor for controlling the pre-driving circuit in response to the output signal of AND gate.

3. A high voltage driving circuit for preventing a transient current according to claim 1, wherein the pre-driving circuit comprises:
   a P-channel transistor, which is connected between a power source terminal and an output terminal of the pre-driving circuit, being operated in response to the driving signal;
   an N-channel transistor which is connected between the output terminal and the ground terminal, being operated in response to the first non-overlap signal; and
   a resistor for feedbacking the output signal of the complementary output circuit to the input terminal of the P-channel transistor.

4. A high voltage driving circuit for preventing an transient current according to claim 1, wherein the pre-driving circuit comprises:
   the first and second P-channel transistors connected in parallel between the power source terminal and the output terminal of the pre-driving circuit;
   a resistor connected between the power source terminal and the input terminal of the first P-channel transistor; and
   an N-channel transistor which is connected between the output terminal and the ground terminal, being operated in response to the first non-overlap signal.

5. A high voltage driving circuit for preventing a transient current, comprising:
   a non-overlap signal generator for generating first and second non-overlap signals in response to a logic level signal;
   first and second stages for generating first and second driving signals in response to the logic level signals and the first and second non-overlap signals;
   a pre-driving circuit that is driven in response to the first non-overlap signal and the first driving signals; and
   a complementary output circuit, which includes pull-up and pull-down transistors, which controls a current flowing toward the output terminal in response to an output signal of the pre-driving circuit and the second driving signal and second non-overlap signal.

6. A high voltage driving circuit for preventing a transient current according to claim 5, said second stage comprising:
   an AND gate for receiving, as input signals, the logic level signal and the first and second non-overlap signals; and
   a resistor for feedbacking the output of the pre-driving stage to the input of the pull-up transistor of the complementary output circuit.

7. A high voltage driving circuit for preventing a transient current according to claim 1, wherein the pre-driving circuit comprises:
   a first P-channel transistor connected between the power source terminal and the output terminal of the pre-driving circuit;
   a second P-channel transistor connected between the power source terminal and the output terminal, driving the first P-channel transistor;
   a second N-channel transistor connected between the output terminal and the ground terminal for being operated in response to the non-overlap signal; and
   a resistor for feedbacking the output signal of the complementary output circuit to the input terminal of the first P-channel transistor.

* * * * *